(12) United States Patent
Suzuki et al.

(10) Patent No.: US 11,092,621 B2
(45) Date of Patent: Aug. 17, 2021

(54) CURRENT SENSOR (71) Applicant: Asahi Kasei Microdevices Corporation, Tokyo (JP)

(72) Inventors: Kenji Suzuki, Tokyo (JP); Kenji Kai, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 175 days.

(21) Appl. No.: 16/299,141

(22) Filed: Mar. 12, 2019

(65) Prior Publication Data

US 2019/0204363 A1    Jul. 4, 2019

Related U.S. Application Data (63) Continuation of application No. PCT/JP2017/018248, filed on May 15, 2017.

(30) Foreign Application Priority Data

Sep. 14, 2016   (JP) .............................. JP2016-179433

(51) Int. Cl.
*G01R 19/00* (2006.01)
*G01R 15/20* (2006.01)

(52) U.S. Cl.
CPC ....... *G01R 15/202* (2013.01); *G01R 19/0092* (2013.01)

(58) Field of Classification Search
CPC ................... G01R 19/0092; G01R 15/20–207
See application file for complete search history.

(56) References Cited

U.S. PATENT DOCUMENTS 4,749,939 A * 6/1988 Seitz ...................... H01F 38/30
  324/117 H
6,356,068 B1 * 3/2002 Steiner ................. G01R 15/202
  324/117 H (Continued)

FOREIGN PATENT DOCUMENTS

JP    2005283451 A    10/2005
JP    2015064243 A    4/2015

(Continued)

OTHER PUBLICATIONS

International Preliminary Report on Patentability for International Application No. PCT/JP2017/018248, issued by the International Bureau of WIPO dated Mar. 19, 2019.

(Continued)

*Primary Examiner* — Patrick Assouad
*Assistant Examiner* — Demetrius R Pretlow (57) ABSTRACT

The present invention provides a current sensor including: a primary conductor through which current to be measured flows; a magnetic sensor which has a magnetosensitive surface and detects magnetic field generated by the current to be measured; a sealing portion sealing the primary conductor and the magnetic sensor; and a plurality of terminals exposed through a side surface of the sealing portion; wherein the primary conductor includes: a first end connected to one of the terminals which is exposed through any one side surface of the sealing portion and through which the current to be measured is input; a second end connected to another one of the terminals exposed through the one side surface and through which the current to be measured is output; and a third end which is connected to one of the terminals exposed through a side surface other than the one side surface.

21 Claims, 8 Drawing Sheets

(56) References Cited

U.S. PATENT DOCUMENTS

| | | |
|---|---|---|
| 8,907,437 B2 | 12/2014 | Milano |
| 2003/0001559 A1* | 1/2003 | Goto .................... G01R 15/202 |
| | | 324/117 H |
| 2004/0080308 A1* | 4/2004 | Goto .................... G01R 15/202 |
| | | 324/117 H |
| 2005/0045359 A1 | 3/2005 | Doogue |
| 2005/0248336 A1 | 11/2005 | Sharma |
| 2006/0219436 A1* | 10/2006 | Taylor .................. G01R 15/202 |
| | | 174/529 |
| 2011/0193557 A1* | 8/2011 | Motz .................... G01R 15/207 |
| | | 324/252 |
| 2012/0081110 A1* | 4/2012 | Racz .................... G01R 15/202 |
| | | 324/252 |
| 2013/0015842 A1* | 1/2013 | Kawaguchi ........ G01R 31/2829 |
| | | 324/200 |
| 2013/0141077 A1* | 6/2013 | Wellenstein ........... G01R 23/02 |
| | | 324/76.39 |
| 2014/0151697 A1* | 6/2014 | Ausserlechner ........ H01L 25/16 |
| | | 257/48 |
| 2014/0253103 A1* | 9/2014 | Racz .................... G01R 1/0416 |
| | | 324/149 |
| 2014/0264678 A1 | 9/2014 | Liu |
| 2015/0015249 A1* | 1/2015 | Ausserlechner ...... B29C 70/745 |
| | | 324/252 |
| 2015/0323568 A1* | 11/2015 | Schmitt ................ G01R 1/0408 |
| | | 324/126 |
| 2016/0282388 A1* | 9/2016 | Milano ............... H01L 21/4828 |
| 2017/0003323 A1* | 1/2017 | Nakayama ............ H02M 7/003 |
| 2017/0160313 A1 | 6/2017 | Koiwa |
| 2018/0003742 A1* | 1/2018 | Shimizu ................. G01R 15/20 |
| 2018/0299493 A1* | 10/2018 | Peccoux .............. G01R 15/207 |

FOREIGN PATENT DOCUMENTS

| | | |
|---|---|---|
| JP | 2015190930 A | 11/2015 |
| JP | 2016004918 A | 1/2016 |
| WO | 2016056135 A1 | 4/2016 |

OTHER PUBLICATIONS

International Search Report for International Patent Application No. PCT/JP2017/018248, issued by the Japan Patent Office dated Jul. 25, 2017.

* cited by examiner

CURRENT SENSOR

The contents of the following Japanese patent application(s) are incorporated herein by reference:
2016-179433 filed in JP on Sep. 14, 2016 and
PCT/JP2017/018248 filed on May 15, 2017.

BACKGROUND

1. Technical Field

The present invention relates to a current sensor.

2. Related Art

Conventionally, a current sensor which uses a magnetic sensor such as a Hall element and a magnetoresistive element is known (see, for example, Patent documents 1 and 2).

Patent document 1 Japanese Patent Application Publication No. 2005-283451

Patent document 2 International Publication No. WO2016/056135

SUMMARY

A current sensor preferably includes a primary conductor having high heat dissipation efficiency.

One aspect of the present invention provides a current sensor. The current sensor may include a primary conductor through which current to be measured flows. The current sensor may include a magnetic sensor which has a magnetosensitive surface and detects magnetic field generated by the current to be measured. The current sensor may include a sealing portion to seal the primary conductor and the magnetic sensor. The current sensor may include a plurality of terminals which are exposed from a side surface of the sealing portion. The primary conductor may include a first end which is connected to a terminal exposed from any one side surface of the sealing portion and through which the current to be measured is input. The primary conductor may include a second end which is connected to another terminal exposed from one side surface and through which the current to be measured is output. The primary conductor may include a third end which is connected to a terminal exposed from a side surface other than the one side surface.

The magnetosensitive surface of the magnetic sensor may be located between the upper surface and the bottom surface of the primary conductor. The magnetosensitive surface of the magnetic sensor may be located in the middle between the upper surface and the bottom surface of the primary conductor. The current to be measured may not flow through the terminal located on a side surface other than the one side surface.

The current sensor may include a signal processing chip which is provided in the sealing portion and processes a signal output from the magnetic sensor. The current sensor may include a secondary-side tab which is provided to be electrically separated from the primary conductor and supports the signal processing chip.

The current sensor may include a first magnetic sensor and a second magnetic sensor. The second magnetic sensor may be located in a region surrounded by portions of the primary conductor through which the current to be measured flows. The first magnetic sensor may be located at the opposite position to the second magnetic sensor with respect to the portions of the primary conductor through which the current to be measured flows.

The magnetic sensor may be exposed on the bottom surface of the sealing portion. The primary conductor may include a recessed portion formed on the bottom side of the primary conductor in at least part of a region facing the magnetic sensor. The magnetosensitive surface of the magnetic sensor may be located in the middle between the upper surface and the lower surface of the primary conductor in the region facing the magnetic sensor.

The height of the recessed portion may be equal to or more than 10% and equal to or less than 70% of the height of the primary conductor. The width of the recessed portion may be equal to or more than 0.1 mm and equal to or less than 0.7 mm.

The signal processing chip may extend from above the secondary-side tab to above the primary conductor. The current sensor may include insulating material which is provided between the signal processing chip, and the secondary-side tab and the primary conductor, and extends from above the secondary-side tab to above the primary conductor.

The magnetic sensor may be a Hall element to detect the vertical magnetic field in the direction perpendicular to the upper surface of the primary conductor. At least one terminal of the plurality of terminals may be provided such that it is exposed on the bottom surface of the sealing portion. The primary conductor may include a bottom surface exposed on the bottom surface of the sealing portion, the exposed bottom surface of the primary conductor being inside the at least one terminal. The primary conductor may have a connection portion which connects at least one terminal to the bottom surface of the primary conductor and is not exposed on the bottom surface of the sealing portion.

Another aspect of the present invention provides a current sensor. The current sensor may include a primary conductor through which the current to be measured flows. The current sensor may include a magnetic sensor which has a magnetosensitive surface and detects magnetic field generated by the current to be measured. The current sensor may include a sealing portion to seal the primary conductor and the magnetic sensor. The magnetic sensor may be exposed on the bottom surface of the sealing portion. In the magnetic sensor, the distance between the bottom surface of the sealing portion and the magnetosensitive surface may be smaller than the distance between the bottom surface of the sealing portion and the upper surface of the primary conductor.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention. However, the following embodiments shall not limit the claimed invention. Also, all the combinations of the features described in the embodiment(s) are not necessarily essential for means provided by aspects of the invention.

Figure 1:
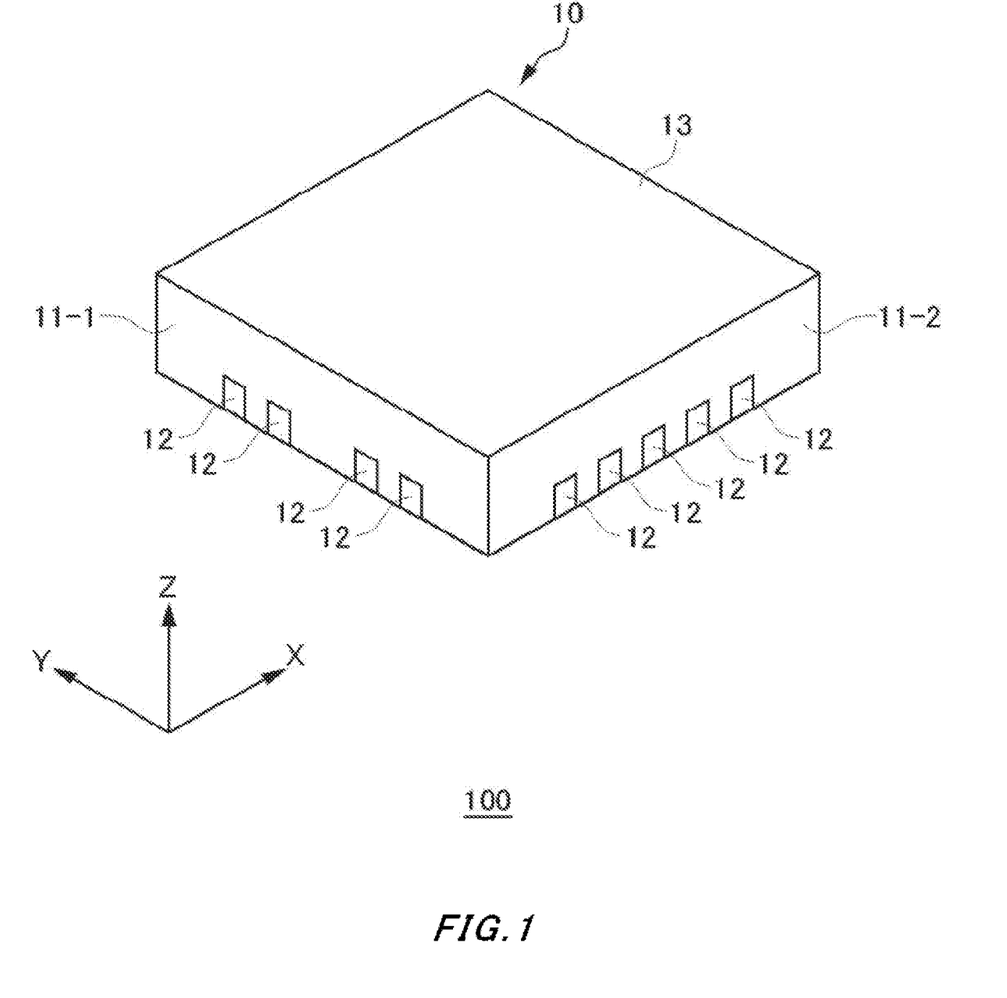
FIG. 1 is a perspective view showing an external appearance of the current sensor 100 according to an embodiment of the present invention.

FIG. 1 is a perspective view showing an external appearance of the current sensor 100 according to an embodiment of the present invention. The current sensor 100 includes a sealing portion 10 which seals a magnetic sensor, a primary conductor, and the like. The sealing portion 10 is made of insulating material such as resin, and is formed to cover at least part of surroundings of the magnetic sensor, the primary conductor, and the like. In other words, the current sensor 100 of the present example has the magnetic sensor and the primary conductor which are sealed in the same sealing portion 10.

The sealing portion 10 of the present example has a plate-like cuboid shape. One of the two principal surfaces of the cuboid shape is referred to as an upper surface 13, and the other is referred to as a bottom surface (the bottom surface 15 in FIG. 2). Also, a surface connecting the two principal surfaces of the cuboid shape is referred to as a side surface 11. Also, the direction perpendicular to the upper surface 13 is referred to as Z-axis direction, the direction perpendicular to the first side surface 11-1 is referred to as X-axis direction, and the direction perpendicular to the second side surface 11-2 adjacent to the first side surface 11-1 is referred to as Y-axis direction.

Terminals 12, made of conductive material, are exposed on at least one of the side surfaces 11. The surfaces of the terminals 12 are located in the same plane with the side surface 11. In another example, the terminals 12 may protrude from the side surface 11. It is noted that each of the terminals 12 may be exposed on the bottom surface of the sealing portion 10.

In the sealing portion 10 of the present example, one or more terminals 12 are exposed on each of the four side surfaces 11. In the example in FIG. 1, four terminals 12 are exposed on the first side surface 11-1, and five terminals 12 are exposed on the second side surface 11-2.

Figure 2:
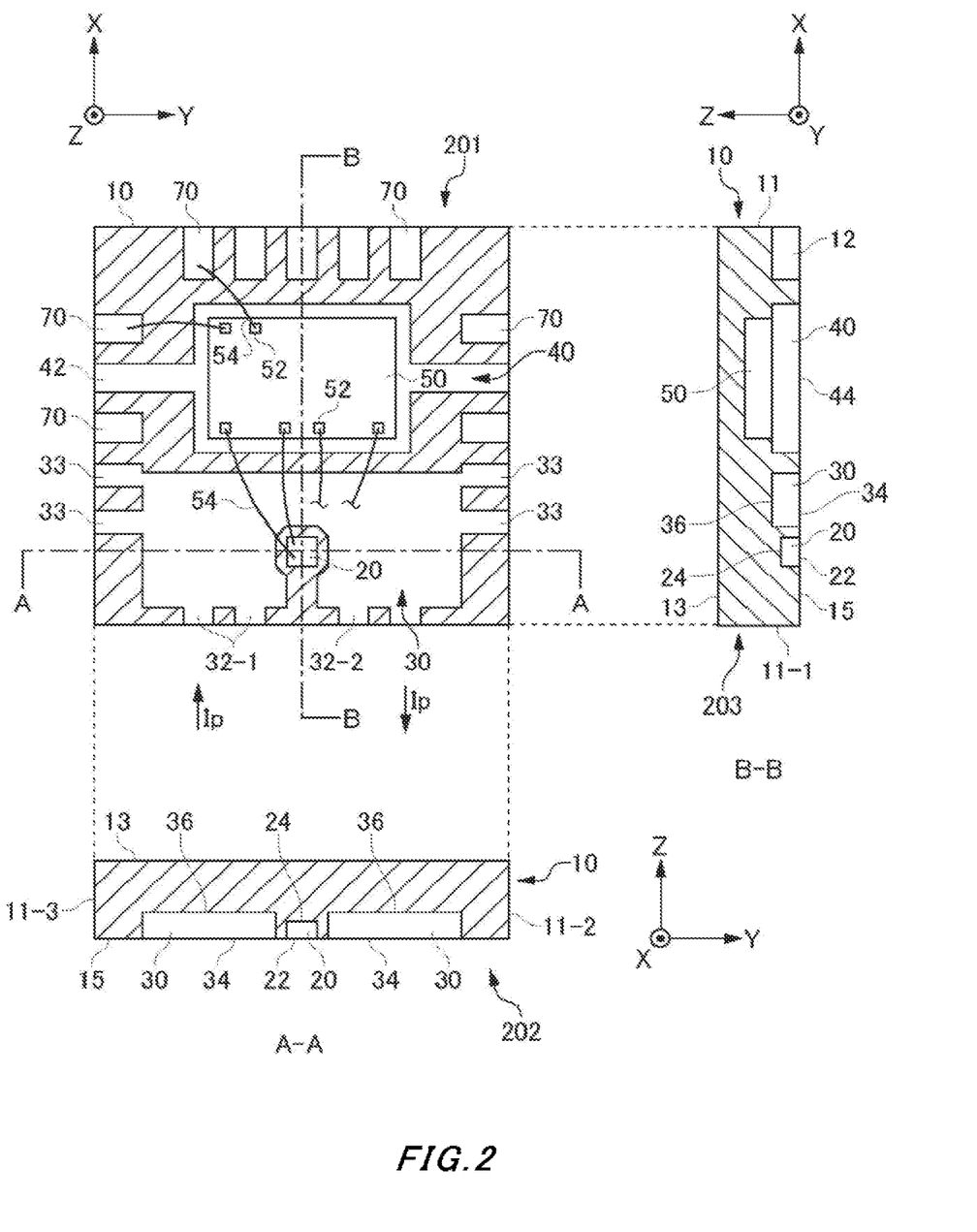
FIG. 2 shows the structure inside the sealing portion 10.

FIG. 2 shows the structure inside the sealing portion 10. The portion 201 shows the internal structure in a plane (the X-Y plane in the present example) parallel to the upper surface 13 of the sealing portion 10. The portion 202 shows the cross section taken along A-A in the portion 201. The portion 203 shows the cross section taken along B-B in the portion 201.

The magnetic sensor 20 and the primary conductor 30 are provided inside the sealing portion 10. The primary conductor 30 is made of conductive material such as metal and the current Ip to be measured flows therethrough. The primary conductor 30 in the present example has a plate-like shape.

The primary conductor 30 in the present example includes a first end 32-1 connected to a terminal 12 exposed on the sealing portion 10, and a second end 32-2 connected to another terminal 12. The first end 32-1 and the second end 32-2 may be connected to the terminals 12 provided on the same side surface 11 (the side surface 11-1 in the present example) of the sealing portion 10. In another example, the first end 32-1 and the second end 32-2 may be connected to the terminals 12 provided on the different side surfaces 11 of the sealing portion 10.

There may be a plurality of first ends 32-1 and a plurality of second ends 32-2 may be provided. Each of the ends 32 is connected to the corresponding terminal 12. The current Ip to be measured is input through the terminal 12 connected to the first end 32-1, and the current Ip to be measured is output through the terminal 12 connected to the second end 32-2.

The primary conductor 30 of the present example has a U-shape in the X-Y plane. In other words, the primary conductor 30 includes an extension portion extending from the first end 32-1 in the positive X-axis direction, an extension portion extending from the second end 32-2 in the positive X-axis direction, and a connection portion extending in the Y-axis direction and connecting the two extension portions. However, the shape of the primary conductor 30 is not limited to the shape shown in FIG. 1.

The magnetic sensor 20 includes a bottom surface 22 and a magnetosensitive surface 24, and detects the current to be measured Ip by detecting the magnetic field generated by the current Ip to be measured. The magnetic sensor 20 in the present example is a Hall element to detect the vertical magnetic field in the Z-axis direction in the magnetosensitive surface 24. The magnetosensitive surface 24 in the present example is the surface opposite to the bottom surface 22.

The magnetic sensor 20 is exposed on the bottom surface 15 of the sealing portion 10. A bottom surface 15 of the sealing portion 10 is, for example, a surface facing the mounting substrate on which the current sensor 100 is to be mounted. In the present example, the entire bottom surface 22 of the magnetic sensor 20 is exposed on the bottom surface 15 of the sealing portion 10 without being covered by the sealing portion 10. It is noted that the bottom surface 22 of the magnetic sensor 20 may be covered by the sealing portion 10 and not be exposed on the bottom surface 15 of the sealing portion 10, and may alternatively be covered by a resin layer and the like different from the sealing portion 10. Also, the bottom surface 22 of the magnetic sensor 20 may be covered by a material for mounting such as die attach film.

The bottom surface 34 of the primary conductor 30 may also be exposed on the bottom surface 15 of the sealing portion 10. The surface of the primary conductor 30 on the opposite side to the bottom surface 34 is referred to as upper surface 36. The magnetosensitive surface 24 of the magnetic sensor 20 is provided at a position lower than the upper surface 36 of the primary conductor 30 so that it can detect a larger magnetic field in the Z-axis direction. Therefore, the current sensor 100 with high sensitivity can be achieved. It is noted that, from the point of view of increasing the signal-noise ratio, the distance between the bottom surface 15 of the sealing portion 10 and the magnetosensitive surface 24 is preferably smaller than the distance between the bottom surface 15 of the sealing portion 10 and the upper surface 36 of the primary conductor 30. The distance indicates the shortest distance in the Z-axis direction.

The magnetosensitive surface 24 is preferably located in the middle between the upper surface 36 and the bottom surface 34 of the primary conductor 30. A reference to "located in the middle" may intend to allow a tolerance about, for example, 10% of the thickness in the Z-axis direction of the primary conductor 30. The magnetic flux density in the vertical direction is largest at the center in the thickness direction of the primary conductor 30. Thus, the detection sensitivity for the vertical magnetic field can be maximized.

The current sensor 100 in the present example may be arranged such that the magnetic sensor 20 is exposed on the bottom surface 15 of the sealing portion 10. Thus, the magnetosensitive surface 24 of the magnetic sensor 20 can be easily located between the upper surface 36 and the bottom surface 34 of the primary conductor 30. For example, the magnetosensitive surface 24 of the magnetic sensor 20 can also be easily located between the upper surface 36 and the bottom surface 34 of the primary conductor 30 by decreasing the thickness in the Z-axis direction of the current sensor 100. Thus, the current sensor 100 with high sensitivity can be easily provided. Also, because the bottom surface 22 of the magnetic sensor 20 is exposed, the heat dissipation efficiency of the magnetic sensor 20 can be improved. Also, the heat dissipation efficiency can further be improved by contacting the bottom surface 22 of the magnetic sensor 20 to the member with high thermal conductivity provided on the mounting substrate.

The magnetic sensor 20 in the present example is located in a region surrounded by the U-shape primary conductor 30 in the X-Y plane. In other words, the magnetic sensor 20 is surrounded by the two extension portion and the connection portion of the primary conductor 30 in the X-Y plane. However, the magnetic sensor 20 does not contact to the primary conductor 30. With such arrangement of the magnetic sensor 20, the magnetic field from the current Ip to be measured flowing through the primary conductor 30 can be efficiently detected.

The primary conductor 30 may have third ends 33 connected to terminals 12 provided on the side surface 11 different from the first side surface 11-1. The primary conductor 30 in the present example includes third ends 33 for each of the both sides of the first side surface 11-1, that is, the second side surface 11-2 and the third side surface 11-3. The current Ip to be measured does not flow through the terminals 12 connected to the third ends 33. For example, the wiring and the like of the mounting substrate on which the current sensor 100 is mounted is designed such that the current Ip to be measured does not flow through the terminals 12. The terminals 12 connected to the third ends 33 are, via the terminal-connecting land on the mounting substrate, connected to the heat dissipation pattern and the like on the mounting substrate where the ends are electrically open. Thus, the heat generated inside the primary conductor 30 can be efficiently dissipated to the mounting substrate. On the other hand, a potential difference does not occur between the terminal-connecting land connected to the third end 33 of the primary conductor 30 via the terminals 12, and the heat dissipation pattern of the mounting substrate. Thus, the current does not flow from the mounting substrate of the primary conductor 30 to the heat dissipation pattern. In other words, in the primary conductor 30 of the present example, the flow path of the current Ip to be measured (from the first end 32-1 to the second end 32-2) is different from the heat dissipation path (from the flow path of the current Ip to be measured to the third end 33). In this manner, the heat dissipation efficiency of the primary conductor 30 can be improved by further connecting the primary conductor 30 to the terminal 12 through which the current Ip to be measured does not flow.

It is noted that the end 32 and the end 33 of the primary conductor 30 may serve as the terminals 12. In other words, the end 32 and the end 33 may be exposed on the side surface 11 and the bottom surface 15 of the sealing portion 10.

The current sensor 100 in the present example further includes the secondary-side tab 40, the signal processing chip 50, and the plurality of secondary-side terminals 70. The secondary-side tab 40 is made of conductive material such as metal and is provided such that it is electrically separated from the primary conductor 30. The material of the secondary-side tab 40 may be the same as the material of the primary conductor 30. The secondary-side tab 40 may have a plate-like shape. The secondary-side tab 40 is insulated from the primary conductor 30 by the sealing portion 10. The secondary-side tab 40 in the present example includes one or more ends 42 connected to any of the terminals 12 of the sealing portion 10.

The signal processing chip 50 is provided on the secondary-side tab 40 and processes the signal output from the magnetic sensor 20. The signal processing chip 50 in the present example is located such that the entire structure lies on the secondary-side tab 40. The signal processing chip 50 may directly contact to the secondary-side tab 40. Thus, the heat from the signal processing chip 50 is readily dissipated via the secondary-side tab 40. The signal processing chip 50 is an integrated circuit formed on the semiconductor substrate such as silicon. The signal processing chip 50 may supply a signal or electrical power for operating the magnetic sensor 20. Also, a correction or calculation may be performed on the signal output from the magnetic sensor 20 to calculate the value of the current flowing through the primary conductor 30.

The current sensor 100 in the present example includes the conductive wire 54 connecting the magnetic sensor 20 to the signal processing chip 50. The wire 54 in the present example connects the magnetic sensor 20 to the signal processing chip 50 by bypassing the primary conductor 30. The wire 54 connects the pad provided on the magnetosensitive surface 24 of the magnetic sensor 20 to the pad 52 provided on the upper surface of the signal processing chip 50.

In the present example, the wire 54 is provided between the pad 52 of the signal processing chip 50 and the secondary-side terminal 70. In FIG. 2, some of the pads 52 and some of the wire 54 of the signal processing chip 50 are omitted. The secondary-side terminal 70 is connected to any of the terminals 12 provided on the sealing portion 10. The signal processing chip 50 exchanges a signal with the exterior circuit via the secondary-side terminal 70 and the terminal 12.

Figure 3A:
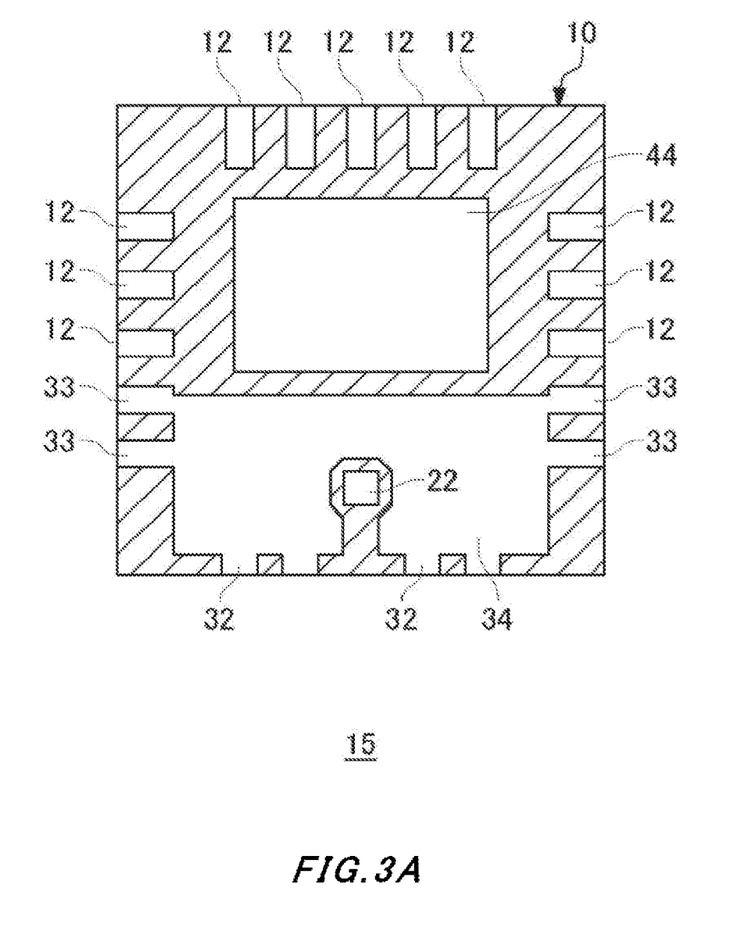
FIG. 3A shows the bottom surface 15 of the sealing portion 10.

FIG. 3A shows the bottom surface 15 of the sealing portion 10. In the bottom surface 15 of the sealing portion 10, the bottom surface 22 of the magnetic sensor 20 may be exposed. Also, the bottom surface 34 of the primary conductor 30 may be exposed. Also, in the present example, the end 32 and the end 33 of the primary conductor 30 are exposed as terminals 12. Further, the bottom surface 44 of the secondary-side tab 40 may be exposed. The bottom surface 34 of the primary conductor 30, the bottom surface 44 of the secondary-side tab 40, and the bottom surface 22 of the magnetic sensor 20 may be flush with each other. If the bottom surface 34 of the primary conductor 30, the bottom surface 44 of the secondary-side tab 40, and the bottom surface 22 of the magnetic sensor 20 are all exposed on the bottom surface of the sealing portion 10, the bottom surface 34, the bottom surface 44, and the bottom surface 22 are exposed on the same plane (the bottom surface of the sealing portion 10) to be flush with each other.

In the present exemplary embodiment, the end 32 of the primary conductor 30 is connected to the land in the mounting substrate through which the current Ip to be measured flows. On the other hand, the regions in the primary conductor 30 other than the end 32 are not connected to the land in the mounting substrate through which the current Ip to be measured flows. However, the end 33 of the primary conductor 30 is preferably connected to the heat dissipation pattern provided on the mounting substrate to increase the heat dissipation of the primary conductor 30. In the mounting substrate, the heat dissipation pattern is in an open state where the end is not connected to other electrical circuits. Thus, the heat dissipation efficiency via the primary conductor 30 can be improved while the current Ip to be measured is flowing through the primary conductor 30.

Also, the bottom surface 44 of the secondary-side tab 40 is preferably connected to the heat dissipation pattern provided on the mounting substrate in order to improve the heat dissipation from the signal processing chip 50. The heat dissipation pattern may be electrically floating in the mounting substrate, and may be applied with a particular potential such as ground potential.

Figure 3B:
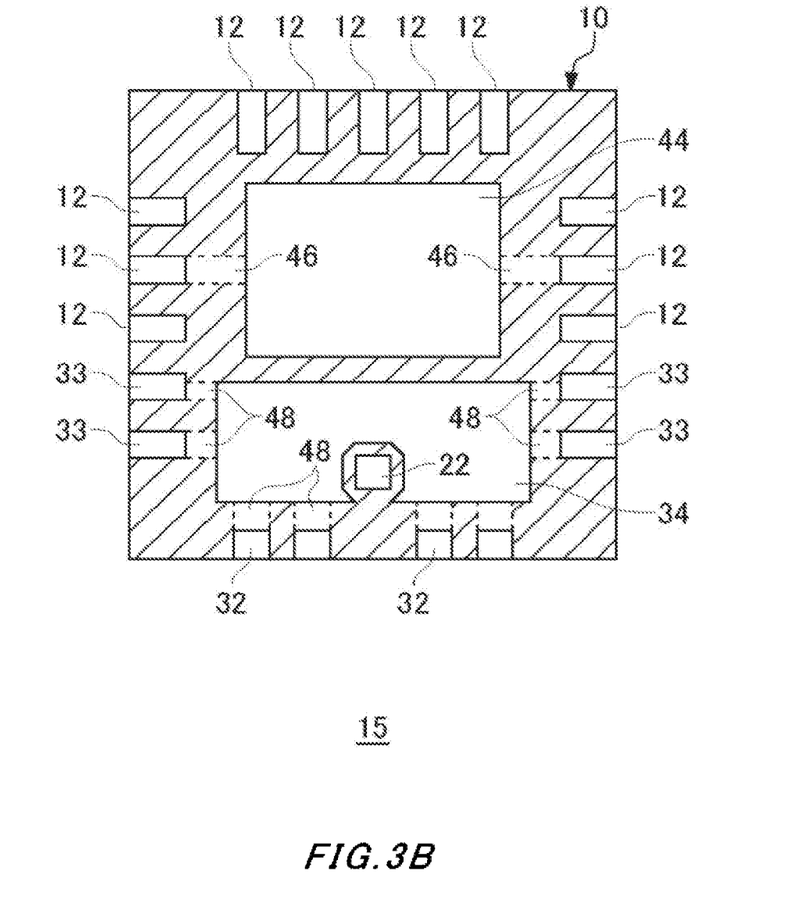
FIG. 3B shows another example of the bottom surface 15 of the sealing portion 10.

FIG. 3B shows another example of the bottom surface 15 of the sealing portion 10. In the present example, the end 32 and the end 33 of the primary conductor 30 serve as the terminals 12. The end 32 and the end 33 of the primary conductor 30 are provided such that they are exposed on the bottom surface 15 of the sealing portion 10.

The bottom surface 34 of the primary conductor 30 may be exposed to the bottom surface 15 of the sealing portion 10, the exposed bottom surface 34 of the primary conductor 30 being inside the end 32 and the end 33. In this case, the bottom surface 34 of the primary conductor 30 is separated from the end 32 and the end 33, in the bottom surface 15 of the sealing portion 10. The resin of the sealing portion 10 is filled between the bottom surface 34, and the end 32 and the end 33.

The primary conductor 30 includes a plurality of connection portions 48 connecting a portion corresponding to the bottom surface 34 to the ends 32 and the ends 33. The connection portion 48 is provided inside the sealing portion 10, and is not exposed to the bottom surface 15 of the sealing portion 10.

The terminals 12 (the ends 32 and the ends 33 in the present example) connected to the primary conductor 30 are connected by solder to the land of the mounting substrate. The solder connection is performed, for example, with reflow treatment. In this case, if the terminals 12 and the bottom surface 34 of the primary conductor 30 are continuously provided in the bottom surface 15 of the sealing portion 10, the solder flows into the bottom surface 34 of the primary conductor 30. This causes nonuniform thickness of solder between the terminals 12 on the secondary side and the terminals 12 on the primary side, possibly resulting in deficient mounting. Also, the current distribution flowing through the primary conductor 30 varies depending on how the solder spreads on the bottom surface 34 of the primary conductor 30, possibly requiring for the retuning of the sensitivity after mounting.

In the present example, the connection portion 48 is provided by implementing a step-formation such as half etching and half blanking between the portion of the bottom surface 34 of the primary conductor 30, and the ends 32 and the ends 33, and resin is filled under the connection portion 48. This can inhibit the solder provided under the ends 32 and the ends 33 from flowing to the bottom surface 34 side of the primary conductor 30.

It is noted that the secondary-side tab 40 may also include the connection portion 46 connecting the terminals 12 to the bottom surface 44. As with the connection portion 48, the connection portion 46 is not exposed on the bottom surface 15 of the sealing portion 10. The connection portion 46 can also be formed by implementing a step-formation such as half etching and half blanking. This can inhibit the solder provided under the terminals 12 from flowing to the bottom surface 44 side of the secondary-side tab 40.

Figure 4:
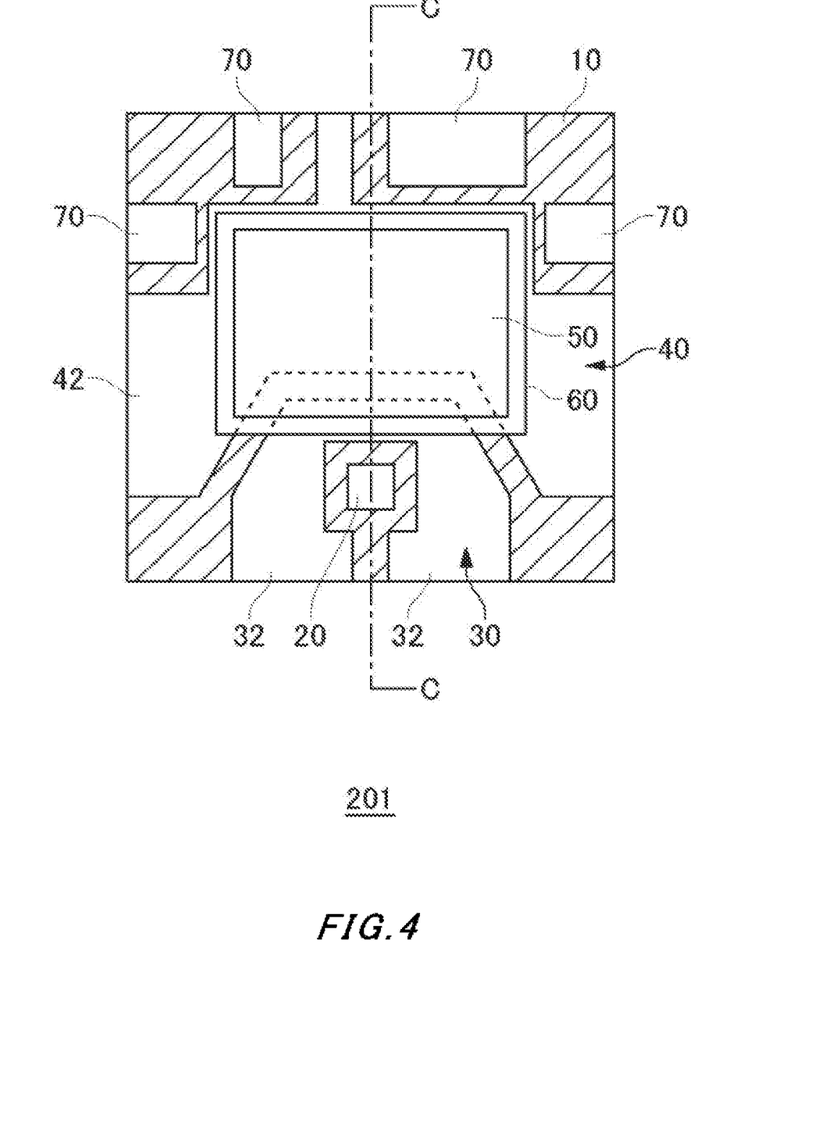
FIG. 4 shows another example of the internal structure of the sealing portion 10.
Figure 5:
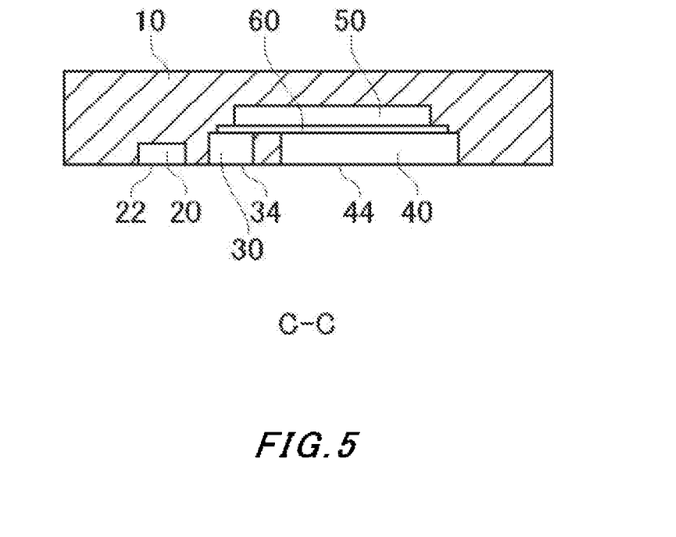
FIG. 5 shows the cross section taken along C-C in the portion 201 shown in FIG. 4.

FIG. 4 shows another example of the internal structure of the sealing portion 10. The internal structure shown in FIG. 4 corresponds to the portion 201 in the X-Y plane shown in FIG. 2. However, the wire 54 and the pads 52 are omitted in FIG. 4. FIG. 5 shows the cross section taken along C-C in the portion 201 shown in FIG. 4.

The signal processing chip 50 in the present example extends from above the secondary-side tab 40 to the above the primary conductor 30. In other words, the signal processing chip 50 is located across the secondary-side tab 40 and the primary conductor 30. In this case, the current sensor 100 preferably further includes the insulating material 60 provided between the signal processing chip 50, and the secondary-side tab 40 and the primary conductor 30. The insulating material 60 extends from the upper surface of the secondary-side tab 40 to the upper surface of the primary conductor 30.

The insulating material 60 may be a tape-like or sheet-like insulator attached to the bottom surface of the signal processing chip 50, and may also be insulating tape made of polyimide and the like. The insulating material 60 may have the same size as the bottom surface of the signal processing chip 50, and more preferably have a size larger than the bottom surface of the signal processing chip 50 for a higher insulation.

The size of the current sensor 100 in the X-Y plane can be reduced by the signal processing chip 50 that also extends above the primary conductor 30. It is noted that the primary conductor 30 shown in FIG. 4 does not include the end 33, but the primary conductor 30 in the present example may also include the end 33 as in the example in FIG. 2.

Figure 6:
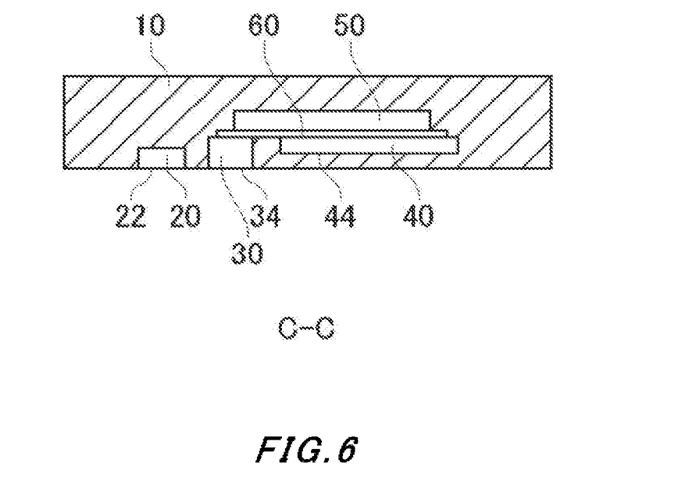
FIG. 6 shows another example of the cross section taken along C-C of the current sensor 100.

FIG. 6 shows another example of the cross section taken along C-C of the current sensor 100. The bottom surface 44 of the secondary-side tab 40 in the present example is not exposed to the bottom surface of the sealing portion 10.

Figure 7:
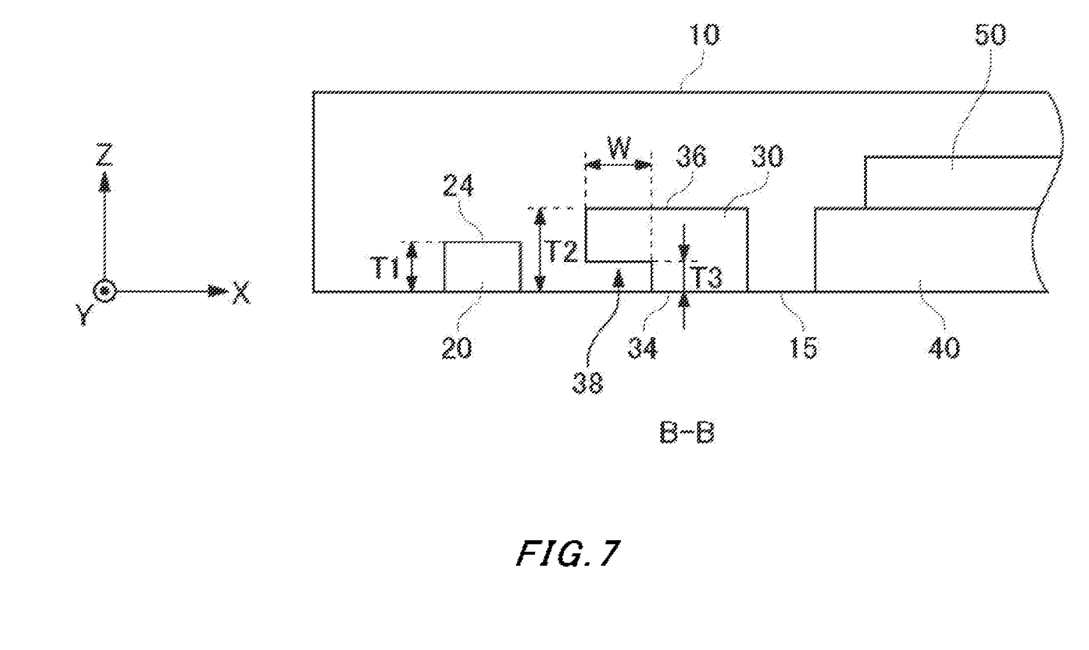
FIG. 7 shows another example of the cross section taken along B-B of the current sensor 100.

FIG. 7 shows another example of the cross section taken along B-B of the current sensor 100. In the present example, the distance in the Z-axis direction between the bottom surface 15 of the sealing portion 10 and the magnetosensitive surface 24 of the magnetic sensor 20 is referred to as T1. Also, the distance in the Z-axis direction between the bottom surface 15 of the sealing portion 10 and the upper surface 36 of the primary conductor 30 is referred to as T2.

Also, the primary conductor 30 in the present example includes the recessed portion 38 formed on the bottom surface 34 side of the primary conductor 30, in at least part of the region facing the magnetic sensor 20. In other words, the region in the primary conductor 30 facing the magnetic sensor 20 is thinner than the other region. As shown in FIG. 7, the recessed portion 38 may be located on the end of the primary conductor 30. In this case, the cross section of the primary conductor 30 has an inverted L-shape. Also, the distance in the X-axis direction between the magnetic sensor 20 and the bottom surface 34 of the primary conductor 30 exposed to the bottom surface 15 of the sealing portion 10 is larger than the distance between the magnetic sensor 20 and the upper surface 36 of the primary conductor 30. The recessed portion 38 is preferably formed across the whole region facing the magnetic sensor 20. The recessed portion 38 may be formed by etching the primary conductor 30 from the bottom surface 34 side.

The distance between the magnetic sensor 20 and the primary conductor 30 in the bottom surface 15 of the sealing portion 10 can be increased by providing the recessed portion 38 in the primary conductor 30. Thus, the dielectric strength between the magnetic sensor 20 and the primary conductor 30 can be increased. This can also prevent the application of the voltage to the back surface of the magnetic sensor 20 caused by the shortening between the bottom surface 22 of the magnetic sensor 20 and the bottom surface 34 of the primary conductor 30 via solder due to the mounting-induced misalignment (the misalignment of solder), for example, when the primary conductor 30 is soldered to the mounting substrate. Also, the sensitivity of the magnetic sensor 20 can be inhibited from decreasing, by keeping the upper surface 36 side of the primary conductor 30 without being etched.

When the recessed portion 38 of the primary conductor 30 is provided as shown in FIG. 7, the distance T1 is preferably smaller than the distance T2. The magnetosensitive surface 24 of the magnetic sensor 20 is preferably located in the middle between the upper surface 36 and the lower surface the primary conductor 30 in the region (the region in which the recessed portion 38 is formed) facing the magnetic sensor. In other words, the distance T1 preferably meets the following equation: T1=T3+(T2−T3)/2=(T2+T3)/2. The position of the magnetosensitive surface 24 becomes comparable to the position where the magnetic flux density in the vertical direction of the primary conductor 30 is large, which can achieve the current sensor with a high sensitivity and a high withstand voltage.

The height in the Z-axis direction of the recessed portion 38 is referred to as T3. The height T3 may be equal to or more than 10% and equal to or less than 70% of the height T2 of the primary conductor 30, and is preferably equal to or more than 40% and equal to or less than 60%. The height T3 is preferably smaller than the height T1 of the magnetic sensor 20. Also, as described above, because T1=(T2+T3)/2 is preferable, the height T3=2T1−T2 is more preferable. Thus, the position of the magnetosensitive surface 24 becomes comparable to the position where the magnetic flux density in the vertical direction of the primary conductor 30 is large, which can achieve the current sensor with a high sensitivity and a high withstand voltage. Also, when the recessed portion 38 is in the above described range, the cost for forming the primary conductor 30 can be reduced by reducing the number of etching operations during the formation of the recessed portion 38, while ensuring the dielectric strength between the magnetic sensor 20 and the primary conductor 30. Also, the width in the X-axis direction of the recessed portion 38 is referred to as W. The width W may be equal to or more than 0.1 mm and equal to or less than 0.7 mm, and is more preferably equal to or more than 0.1 mm and equal to or less than 0.4 mm. This can inhibit the increase in the resistance of the primary conductor 30, while ensuring the dielectric strength between the magnetic sensor 20 and the primary conductor 30, which can achieve a small current sensor with a high withstand voltage. This also can prevent the application of the voltage to the back surface of the magnetic sensor 20 due to a small mounting-induced misalignment with the mounting substrate, while inhibiting the sensitivity of the magnetic sensor 20 from decreasing.

Figure 8:
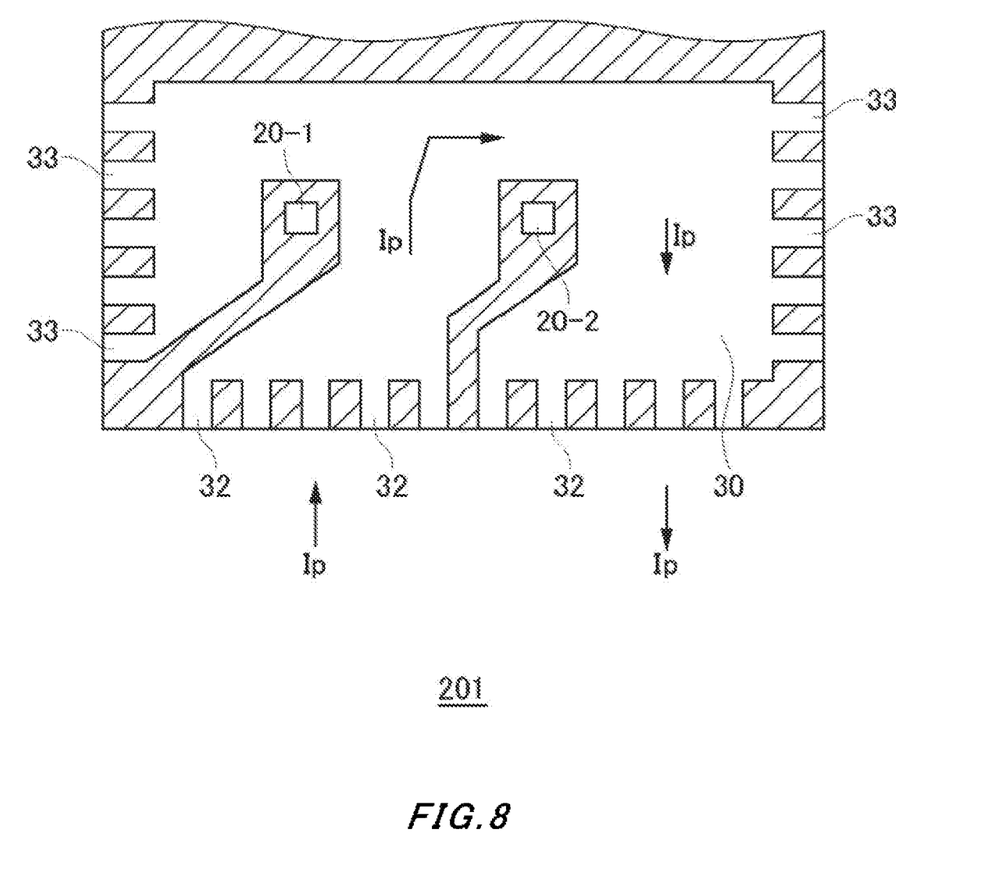
FIG. 8 shows another example of the internal structure of the sealing portion 10.

FIG. 8 shows another example of the internal structure of the sealing portion 10. The internal structure shown in FIG. 8 corresponds to the portion 201 in the X-Y plane shown in FIG. 2. However, the wire 54, the secondary-side tab 40, the signal processing chip 50, and the secondary-side terminal 70 are omitted in FIG. 8.

The current sensor 100 in the present example includes the first magnetic sensor 20-1 and the second magnetic sensor 20-2. The first magnetic sensor 20-1 may have the same structure as the second magnetic sensor 20-2.

The second magnetic sensor 20-2 has the similar structure and arrangement to the magnetic sensor 20 described in FIG. 1 to FIG. 7. In other words, the second magnetic sensor 20-2 is located in the region surrounded by the portion in the primary conductor 30 through which the current Ip to be measured flows. The first magnetic sensor 20-1 is located in the region which is not surrounded by the portion in the primary conductor 30 through which the current Ip to be measured flows. The first magnetic sensor 20-1 of the present example is located such that it is surrounded by the primary conductor 30 from the end 32 to the end 33 in the X-Y plane.

The first magnetic sensor 20-1 and the second magnetic sensor 20-2 are located such that the portions in the primary conductor 30 through which the current Ip to be measured flows is interposed therebetween. In other words, the first magnetic sensor 20-1 is located in the opposite position to the second magnetic sensor 20-2, with respect to the portion in the primary conductor 30 through which the current Ip to be measured flows. Also, the both bottom surfaces 22 of the first magnetic sensor 20-1 and the second magnetic sensor 20-2 may be exposed on the bottom surface 15 of the sealing portion 10.

In this case, the primary conductor 30 may have recessed portions (not shown) formed on the bottom surface 34 side of the primary conductor 30, in at least part of the region facing the first magnetic sensor 20-1 and in at least part of the region facing the second magnetic sensor 20-2. In other words, in the primary conductor 30, the region facing the first magnetic sensor 20-1 and the region facing the second magnetic sensor 20-2 may be thinner than the other regions. The recessed portion may have the similar structure to the recessed portion 38 described in FIG. 7. The recessed portion may be located on each end of the primary conductor 30. In this case, the cross section of the portion interposed between the first magnetic sensor 20-1 and the second magnetic sensor 20-2 of the primary conductor 30 has a T-shape.

Also, the distance in the X-axis direction between the bottom surface of the first magnetic sensor 20-1 exposed to the bottom surface 15 of the sealing portion 10 and the bottom surface 34 of the primary conductor 30 is larger than the distance between the magnetosensitive surface of the first magnetic sensor 20-1 and the upper surface 36 of the primary conductor 30 when viewed from the upper surface 13 of the sealing portion 10. Similarly, the distance in the X-axis direction between the bottom surface of the second magnetic sensor 20-2 exposed to the bottom surface 15 of the sealing portion 10 and the bottom surface 34 of the primary conductor 30 is larger than the distance between the magnetosensitive surface of the second magnetic sensor 20-2 and the upper surface 36 of the primary conductor 30 when viewed from the upper surface 13 of the sealing portion 10. The recessed portion is preferably formed across the whole region facing the first magnetic sensor 20-1 and the second magnetic sensor 20-2. The recessed portion may be formed by etching the primary conductor 30 from the bottom surface 34 side.

The signal processing chip 50 is connected to the first magnetic sensor 20-1 and the second magnetic sensor 20-2. The signal processing chip 50 may calculate the difference between the magnetic field detected by the first magnetic sensor 20-1 and the magnetic field detected the second magnetic sensor 20-2. Such process can reduce the effect of the magnetic field from outside, enabling the precise calculation of the current value of the current Ip to be measured.

While the embodiments of the present invention have been described, the technical scope of the invention is not limited to the above described embodiments. It is apparent to persons skilled in the art that various alterations and improvements can be added to the above described embodiments. It is also apparent from the scope of the claims that the embodiments added with such alterations or improvements can be included in the technical scope of the invention.

What is claimed is:

1. A current sensor comprising:
    a primary conductor through which current to be measured flows;
    a magnetic sensor which has a magnetosensitive surface and a side surface substantially perpendicular to the magnetosensitive surface, and detects magnetic field generated by the current to be measured;
    a sealing portion which seals the primary conductor and the magnetic sensor; and
    a plurality of terminals exposed through side surfaces of the sealing portion;
    wherein the primary conductor includes:
    a first end which is connected to one of the terminals exposed through any one side surface of the sealing portion and through which the current to be measured is input; and
    a second end which is connected to another one of the terminals exposed through the one side surface and through which the current to be measured is output,
    wherein
    the primary conductor is a plate-like shape and has a recessed portion formed on a bottom side of the primary conductor in at least part of a region thereof facing the side surface of the magnetic sensor.

2. The current sensor according to claim 1, wherein
    the magnetosensitive surface of the magnetic sensor is located between an upper surface and a bottom surface of the primary conductor.

3. The current sensor according to claim 1, wherein
    the magnetosensitive surface of the magnetic sensor is located in a middle between an upper surface and a bottom surface of the primary conductor.

4. The current sensor according to claim 1, wherein
    the current to be measured does not flow through a terminal located at a side surface other than the one side surface.

5. The current sensor according to claim 1, further comprising:
    a signal processing chip which is provided in the sealing portion and processes a signal output by the magnetic sensor; and
    a secondary-side tab which is provided to be electrically separated from the primary conductor, and supports the signal processing chip.

6. The current sensor according to claim 1, the magnetic sensor including a first magnetic sensor and a second magnetic sensor, wherein
    the second magnetic sensor is located in a region surrounded by portions in the primary conductor through which the current to be measured flows and the first magnetic sensor is located at an opposite position to the second magnetic sensor with respect to the portions in the primary conductor through which the current to be measured flows.

7. The current sensor according to claim 1, where
    the magnetic sensor is exposed on a bottom surface of the sealing portion.

8. The current sensor according to claim 1, wherein
    the magnetosensitive surface of the magnetic sensor is located in a middle between an upper surface and a lower surface of the primary conductor in a region thereof facing the magnetic sensor.

9. The current sensor according to claim 8, wherein
    a height of the recessed portion is equal to or more than 10% of a height of the primary conductor and equal to or less than 70% of a height of the primary conductor.

10. The current sensor according to claim 8, wherein
    a width of the recessed portion is equal to or more than 0.1 mm and equal to or less than 0.7 mm.

11. The current sensor according to claim 5, wherein
    the signal processing chip extends from above the secondary-side tab to above the primary conductor.

12. The current sensor according to claim 11, further comprising
    an insulating material which is provided between the signal processing chip, and the secondary-side tab and the primary conductor, and extends from above the secondary-side tab to above the primary conductor.

13. The current sensor according to claim 1, wherein
    the magnetic sensor is a Hall element which detects vertical magnetic field in a direction perpendicular to an upper surface of the primary conductor.

14. The current sensor according to claim 1, wherein
    at least one terminal of the plurality of terminals is provided to be exposed on a bottom surface of the sealing portion, and
    the primary conductor has:
    a bottom surface exposed on a bottom surface of the sealing portion, the exposed bottom surface of the primary conductor being inside the at least one terminal; and
    a connection portion which connects the at least one terminal to the bottom surface of the primary conductor and which is not exposed on the bottom surface of the sealing portion.

15. The current sensor according to claim 2, wherein the current to be measured does not flow through a terminal located at a side surface other than the one side surface.

16. The current sensor according to claim 2, further comprising:
    a signal processing chip which is provided in the sealing portion and processes a signal output by the magnetic sensor; and
    a secondary-side tab which is provided to be electrically separated from the primary conductor, and supports the signal processing chip.

17. The current sensor according to claim 2, the magnetic sensor including a first magnetic sensor and a second magnetic sensor, wherein
    the second magnetic sensor is located in a region surrounded by portions in the primary conductor through which the current to be measured flows and the first magnetic sensor is located at an opposite position to the second magnetic sensor with respect to the portions in the primary conductor through which the current to be measured flows.

18. The current sensor according to claim 2, wherein the magnetic sensor is exposed on a bottom surface of the sealing portion.

19. The current sensor according to claim 2, wherein
at least one terminal of the plurality of terminals is provided to be exposed on a bottom surface of the sealing portion, and
the primary conductor has:
a bottom surface exposed on a bottom surface of the sealing portion, the exposed bottom surface of the primary conductor being inside the at least one terminal; and
a connection portion which connects the at least one terminal to the bottom surface of the primary conductor and which is not exposed on the bottom surface of the sealing portion.

20. The current sensor according to claim 1, wherein
the primary conductor further includes a third end which is connected to one of the terminals exposed through a side surface other than the one side surface.

21. A current sensor comprising:
a primary conductor through which current to be measured flows;
a magnetic sensor which has a magnetosensitive surface and detects magnetic field generated by the current to be measured;
a sealing portion which seals the primary conductor and the magnetic sensor; and
a plurality of terminals exposed through side surfaces of the sealing portion;
wherein the primary conductor includes:
a first end which is connected to one of the terminals exposed through any one side surface of the sealing portion and through which the current to be measured is input; and
a second end which is connected to another one of the terminals exposed through the one side surface and through which the current to be measured is output, wherein
the magnetic sensor is exposed on a bottom surface of the sealing portion and
the primary conductor has a recessed portion formed on a bottom side of the primary conductor in at least part of a region thereof facing the magnetic sensor.

* * * * *